United States Patent
Kamo et al.

(10) Patent No.: US 8,173,332 B2
(45) Date of Patent: May 8, 2012

(54) REFLECTION-TYPE EXPOSURE MASK AND METHOD OF MANUFACTURING A SEMICONDUCTOR DEVICE

(75) Inventors: Takashi Kamo, Yokohama (JP); Osamu Suga, Tokyo (JP)

(73) Assignees: Kabushiki Kaisha Toshiba, Tokyo (JP); Renesas Technology Corp., Tokyo (JP)

( * ) Notice: Subject to any disclaimer, the term of this patent is extended or adjusted under 35 U.S.C. 154(b) by 208 days.

(21) Appl. No.: 12/749,250

(22) Filed: Mar. 29, 2010

(65) Prior Publication Data

US 2011/0020737 A1 Jan. 27, 2011

(30) Foreign Application Priority Data

Jul. 23, 2009 (JP) ................. 2009-172367

(51) Int. Cl.
*G03F 1/00* (2012.01)
(52) U.S. Cl. ........................................................ 430/5
(58) Field of Classification Search .............. 430/5, 394; 378/35
See application file for complete search history.

(56) References Cited

U.S. PATENT DOCUMENTS

2006/0222961 A1  10/2006  Yan

FOREIGN PATENT DOCUMENTS

| JP | 2002-280291 | 9/2002 |
|----|-------------|--------|
| JP | 2004-207593 | 7/2004 |
| JP | 2005-527964 | 9/2005 |
| JP | 2006-148113 | 6/2006 |
| JP | 2006-332679 | 12/2006 |

OTHER PUBLICATIONS

Kamo, T. et al., "Effects of Mask Absorber Thickness on Printability in EUV Lithography with High Resolution Resist," Proc. of SPIE, vol. 7028, pp. 70281R-1 to 70281R-12, (2008).

*Primary Examiner* — Stephen Rosasco
(74) *Attorney, Agent, or Firm* — Finnegan, Henderson, Farabow, Garrett & Dunner, L.L.P.

(57) ABSTRACT

A reflection-type exposure mask includes a multilayer reflective film in a main surface and serving as a high reflective region to an exposure light, and an absorber pattern on the multilayer reflective film and serving as a low reflective region to the exposure light, wherein a phase difference between reflection lights of the exposure light from the multilayer reflective film and the absorber pattern is in a range of 180°±10°, and the absorber pattern includes first and second linear patterns having longitudinal directions intersecting at right angles, contrast values of optical images of the first and second linear patterns formed on a wafer is to be 0.6 or more when one of the longitudinal directions of the first and second patterns agree with an incident direction of the exposure light to the main surface viewed from above the main surface.

20 Claims, 8 Drawing Sheets

REFLECTION-TYPE EXPOSURE MASK AND METHOD OF MANUFACTURING A SEMICONDUCTOR DEVICE

CROSS-REFERENCE TO RELATED APPLICATIONS

This application is based upon and claims the benefit of priority from prior Japanese Patent Application No. 2009-172367, filed Jul. 23, 2009, the entire contents of which are incorporated herein by reference.

BACKGROUND OF THE INVENTION

1. Field of the Invention

The present invention relates to a reflection-type exposure mask which is used for EUV (Extreme Ultra-Violet) exposure, and a method of manufacturing a semiconductor device.

2. Description of the Related Art

In recent years, for further microfabrication of devices, the development of EUV exposure techniques has been promoted. In EUV exposure, a reflection-type exposure mask is used. In general, the reflection-type exposure mask comprises a multilayer reflection film which reflects EUV light, and an absorber pattern which is provided on the multilayer reflection film and absorbs EUV light. This absorber pattern has a pattern corresponding to a pattern that is to be formed on a wafer.

EUV light enters obliquely onto the reflection-type exposure mask. Thus, if the thickness of the absorber pattern is great (i.e. the aspect ratio is high), a phenomenon called "shadowing effect" occurs. The shadowing effect affects the dimensions of a transfer pattern. In order to reduce a dimensional error of the transfer pattern due to the shadowing effect, it is necessary to reduce the thickness of the absorber pattern. As a method therefor, there is known a method using a halftone-type phase shift mask (Proc. of SPIE2008 T. Kamo, "Effects of mask absorber thickness on printability in EUV Lithography with high resolution resist").

The following items (1) and (2) have been understood by a reflectance simulation using optical constants (e.g. refractive index n and attenuation coefficient k) of various materials as parameters, and by a lithography simulation using an exposure condition and a mask condition as parameters.

(1) The case of realizing a halftone-type phase shift mask by using Ta-based material or Cr-based material as the material of the absorber pattern.

when the phase difference between an EUV light reflected by the multilayer reflection film (multilayer film reflection light) and an EUV light not absorbed by the absorber pattern and reflected by the absorber pattern (absorber reflection light) is 180°, the reflectance ratio therebetween (the reflectance of absorber reflection light/the reflectance of multilayer reflection light) needs to be set in a range of 1% to 3%.

(2) The case of realizing a halftone-type phase shift mask by using CrN-based material as the material of a buffer layer and using TaBN-based material as the material of the absorber pattern.

The total thickness of the buffer layer and the absorber pattern is reduced to 61 nm from a conventional standard of 80 nm. In this manner, by reducing the thickness of the absorber pattern, etc. so as to realize the halftone-type phase shift mask, the shadowing effect can be reduced with respect to the pattern dimensions of about 32 nm HP to 22 nm HP. Thereby, pattering can be performed without degrading a transfer image.

However, if the target dimension reaches a finer dimensional region, the tendency becomes obvious that a line pattern extending perpendicular to the incident direction of EUV light has a lower contrast value of an optical image, which is formed on a wafer, than a line pattern extending in parallel to the incident direction of EUV light. That is, if the target dimension reaches a finer dimensional region, there arises such a problem that it is difficult to form an optical image having an adequate contrast value on the wafer by using a conventional reflection-type exposure mask.

BRIEF SUMMARY OF THE INVENTION

According to an aspect of the present invention, there is provided a reflection-type exposure mask comprising: a main surface to be irradiated with exposure light; a multilayer reflective film provided in the main surface and serving as a high reflective region to the exposure light such; and an absorber pattern provided on the multilayer reflective film and configured to absorb the exposure light while serving as a low reflective region to the exposure light; wherein a phase difference between a reflection light of the exposure light from the multilayer reflective film and a reflection light of the exposure light from the absorber pattern is in a range of 180°±10°, and the absorber pattern comprises a first linear pattern, and a second linear pattern having a longitudinal direction perpendicular to that of the first linear pattern, the first and second patterns are configured such that contrast values of optical images of the first and second linear patterns on a wafer are to be 0.6 or more in a case where one of the longitudinal directions of the first and second patterns agree with an incident direction of the exposure light to the main surface viewed from above the main surface.

According to an aspect of the present invention, there is provided a method of manufacturing a semiconductor device comprising: exposing a resist formed on a substrate including a semiconductor substrate by using a reflection-type exposure mask of an aspect of the present invention; forming a resist pattern by developing the exposed resist; and etching the substrate by using the resist pattern as a mask.

DETAILED DESCRIPTION OF THE INVENTION

An embodiment of the invention will now be described with reference to the accompanying drawings.

FIG. 1A to FIG. 1D are cross-sectional views for describing a method of manufacturing a reflection-type exposure mask according to the present embodiment.

Figure 1A:
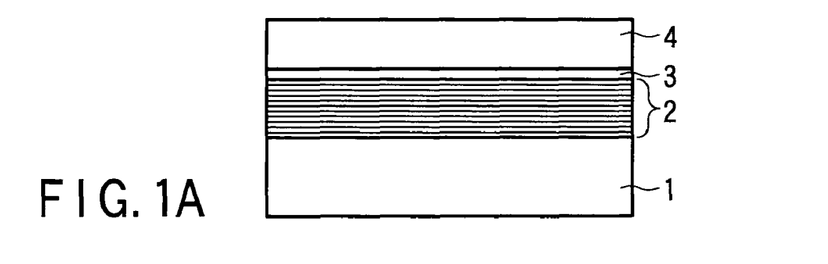
FIG. 1A, FIG. 1B, FIG. 1C and FIG. 1D are cross-sectional views for describing a method of manufacturing a reflection-type exposure mask according to an embodiment.

[FIG. 1A]

A multilayer reflection film 2 (high reflection region) which reflects EUV (exposure light), is formed on a glass substrate 1 having low thermal expansion coefficient. The multiplayer reflection film 2 is configured such that a plurality of pairs of a Mo film and a Si film which are stacked. In the present embodiment, the number of pairs of a Mo film and a Si film is 40, the thickness of the No film is 2.8 nm, and the thickness of the Si film is 4.2 nm. In addition, in the present embodiment, the main surface (surface to be irradiated with exposure light) of the glass substrate 1 is the surface on which the multilayer reflection film 2 is formed (i.e. the top surface of the glass substrate 1 shown in FIG. 1A).

Subsequently, a protective film (cap film) 3 is formed on the multiplayer reflection film 2. Here, a film including a Si film with a thickness of 11 nm is used as the protective film 3 for instance. The protective film 3 has a function of protecting the Mo films, which constitute the multilayer reflection film, from oxidation. An absorber layer 4, which includes Ru as a main component and has a thickness of 30 nm, is formed on the protective film 3. Thus, mask blanks for reflection-type exposure can be obtained. The absorber layer 4 does not completely absorb exposure light, but reflects part of the exposure light (low reflection region).

Here, the reflection-type exposure mask blanks (glass substrate 1, multiplayer reflection film 2, protective film 3 and absorber layer 4) is formed, but instead, a reflection-type exposure mask blanks, in which the multiplayer reflection film 2, the protective film 3 and the absorber layer 4 are previously formed on the glass substrate 1, may be used. In the case where the glass substrate 1 is to be held by an electrostatic chuck, a conductive film for the electrostatic chuck is formed on the back surface of the glass substrate 1.

Figure 1B:
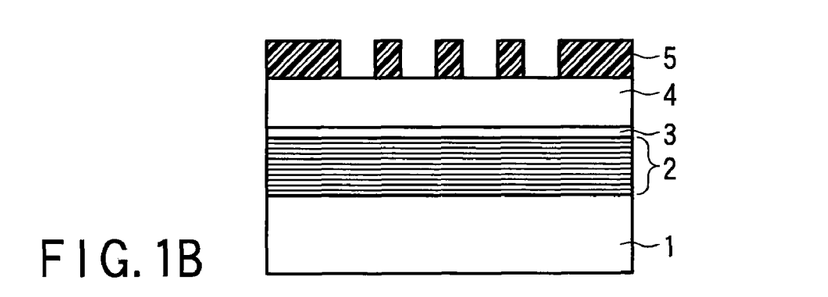

[FIG. 1B]

A resist is applied on the absorber layer 4, and EB (Electron Beam) drawing and development are performed on the applied resist. Thereby, a resist pattern 5 is formed on the absorber layer 4.

Figure 1C:
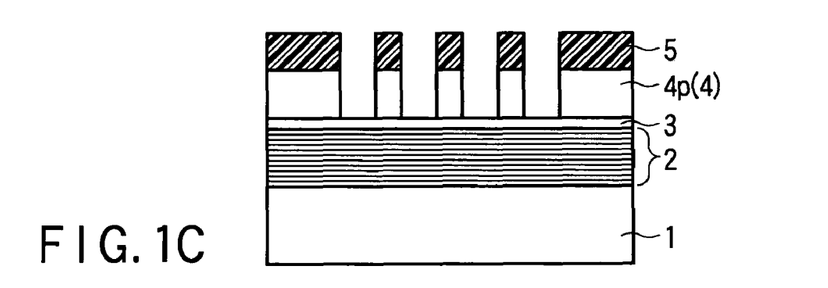

[FIG. 1C]

By using the resist pattern 5 as a mask, the absorber layer 4 is etched by RIE (Reactive Ion Etching) process using a gas which includes chlorine and oxygen as main components. Thus, an absorber pattern 4P of a single-layer structure, which includes Ru as a main component, is formed. At this time, the protective film 3 functions as an etching stopper and prevents etching of the multiplayer reflection film 2. The advantage of using the absorber pattern 4P of the single-layer structure is that the condition for the absorber etching in the mask process can be simplified. However, even in the case of an absorber comprising a plurality of layers, which will be described later, no problem arises if the absorber can be etched in a proper shape.

Figure 7A:
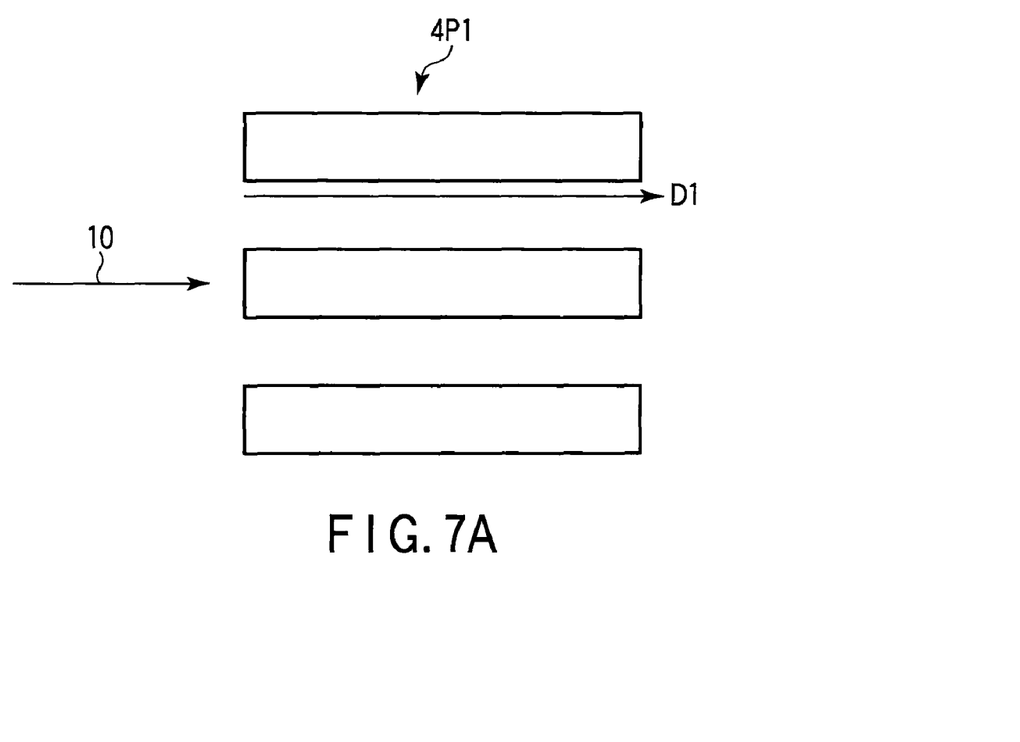
FIG. 7A and FIG. 7B are plan views for describing the parallel pattern and perpendicular pattern.
Figure 7B:
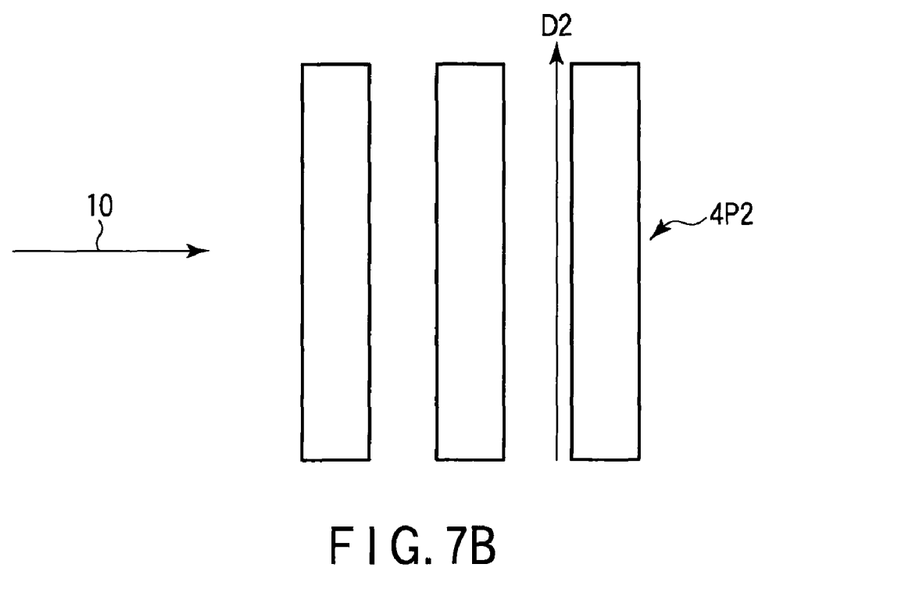

The absorber pattern 4P includes a linear (line-like) pattern 4P1 (first linear pattern) having a first longitudinal direction D1, as shown in FIG. 7A, and a linear pattern 4P2 (second linear pattern) having a second longitudinal direction D2 which is at 90° to the first longitudinal direction D1, as shown in FIG. 7B. The longitudinal direction D1 of the linear pattern 4P1 agrees with the incident direction of EUV light 10 (hereinafter, simply referred to as "light incidence direction") to the main surface, when viewed from above the main surface.

Figure 8A:
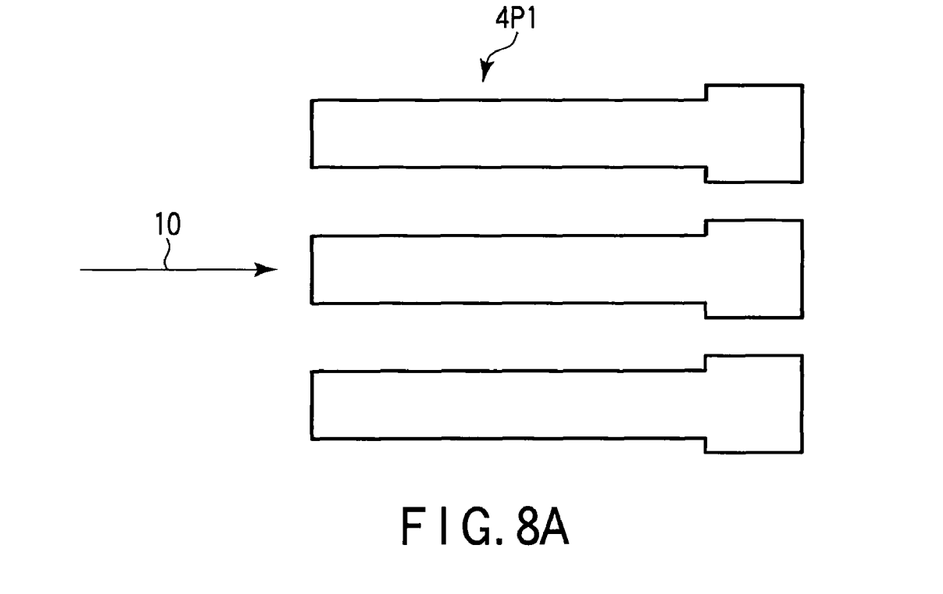
FIG. 8A and FIG. 8B are plan views for describing an example of linear pattern other than L&S pattern.
Figure 8B:
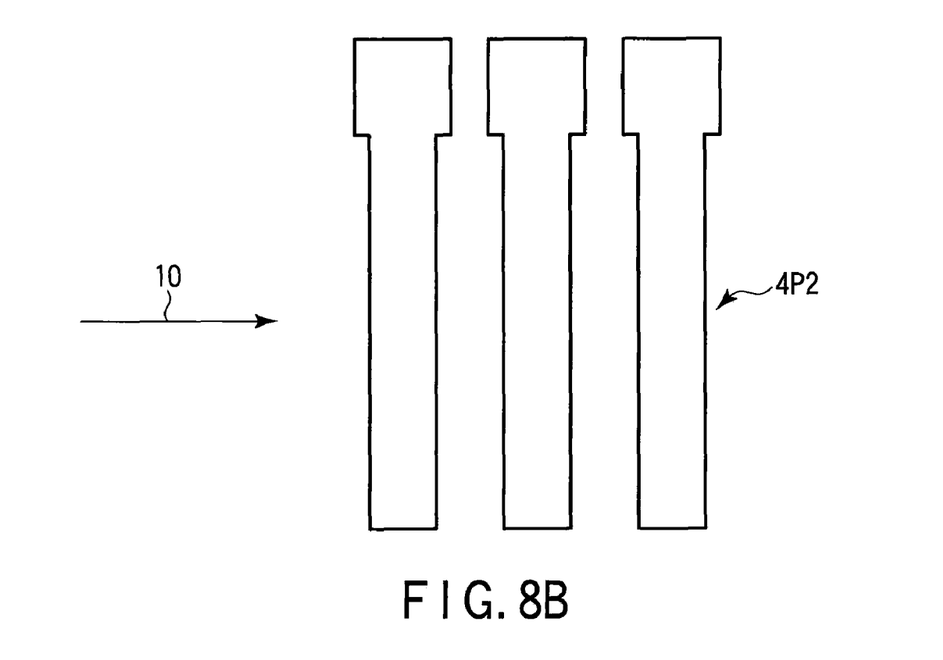

Here, the linear pattern 4P1, 4P2 is, for example, a line-and-space pattern (L&S pattern). However, the linear pattern 4P1, 4P2 is not necessarily a perfect line pattern. For example, as shown in FIG. 8A and FIG. 8B, the linear pattern may be a line pattern with rectangular end portions. That is, the linear pattern is not specifically limited, if the linear pattern has a line shape as a whole.

Figure 1D:
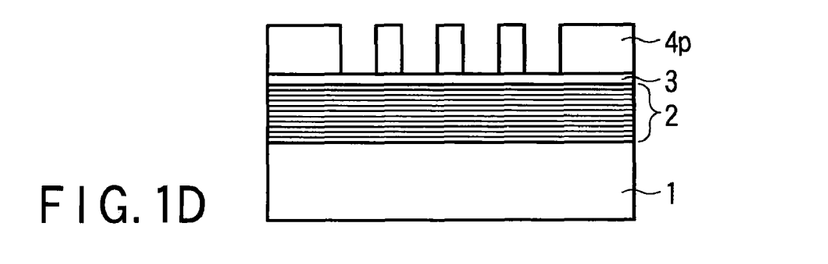

[FIG. 1D]

The resist pattern 5 is peeled, and then the resultant structure is subjected to a well-known washing step, mask defect inspection step, correction step and final washing step. Thus, the reflection-type exposure mask is completed.

In the above description, no mention has been made of a countermeasure to leak light from a neighboring shot on the wafer at the time of exposure. This kind of countermeasure may be a well-known anti-light-leak technique, such as formation of a light shield zone by multilayer film etching, or use of blanks in which an absorber for light shield is provided on a high reflectance absorber.

Figure 2:
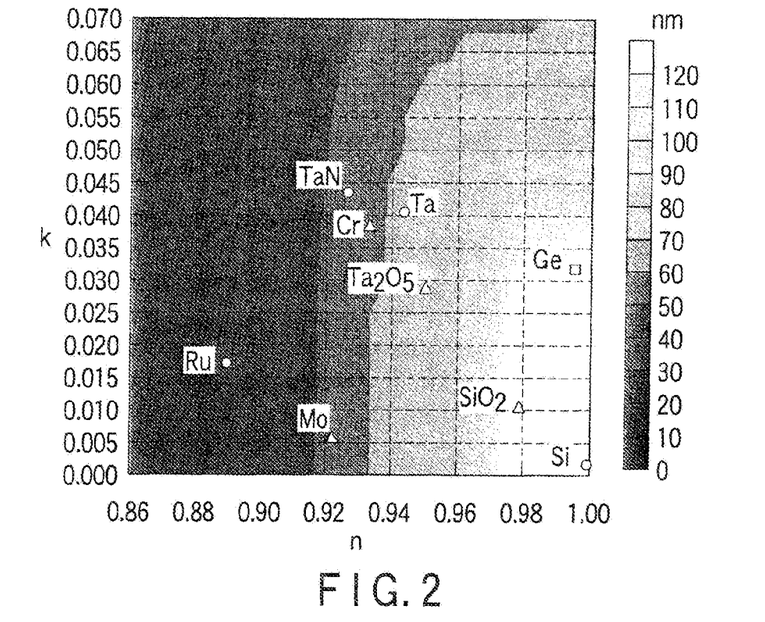
FIG. 2 is a graph showing contour lines of the thickness of an absorber layer which satisfies a phase difference of 180°.

FIG. 2 shows contour lines of the thickness of the absorber layer, at which the phase difference between EUV light reflected by the Mo/Si multilayer reflection film and EUV light reflected by the absorber layer is 180°, in a two-dimensional plane (n-k plane) in the case where the refractive index n of the material of the absorber layer (absorber material) is plotted on the abscissa and the attenuation coefficient k of the absorber material is plotted on the ordinate, with respect to the reflection-type exposure mask (the structure of FIG. 1D). The reflection-type exposure mask comprises the glass substrate; the Mo/Si multilayer reflection film provided on the glass substrate; the protective film formed of the Si film provided on the Mo/Si multilayer reflection film; and the absorber pattern provided on the protective film. FIG. 2 shows, as concrete examples of the absorber material, Ru, Mo, TaN, Cr, Ta, $Ta_2O_5$, $SiO_2$, Ge, and Si.

Figure 3:
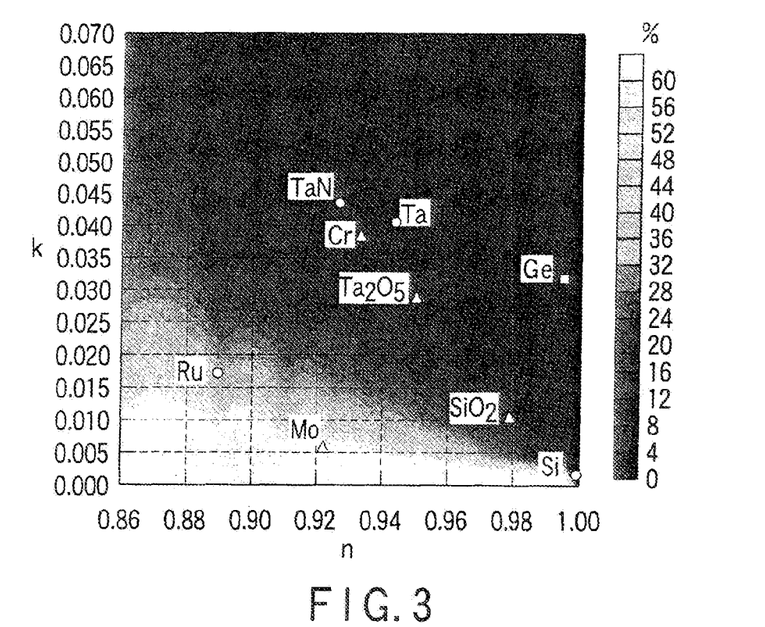
FIG. 3 is a graph showing contour lines of a reflectance ratio in the case of the phase difference of 180°.

FIG. 3 shows contour lines of the reflectance ratio in the case of using the absorber layer with the thickness at which the phase difference becomes 180° on the above-described n-k plane, in the reflection-type exposure mask. The reflectance ratio is defined by 100·R2/R1, where R1 is a reflectance of EUV light reflected by the Mo/Si multilayer reflection film including the protective film, and R2 is a reflectance of EUV light reflected by the absorber layer.

Figure 4:
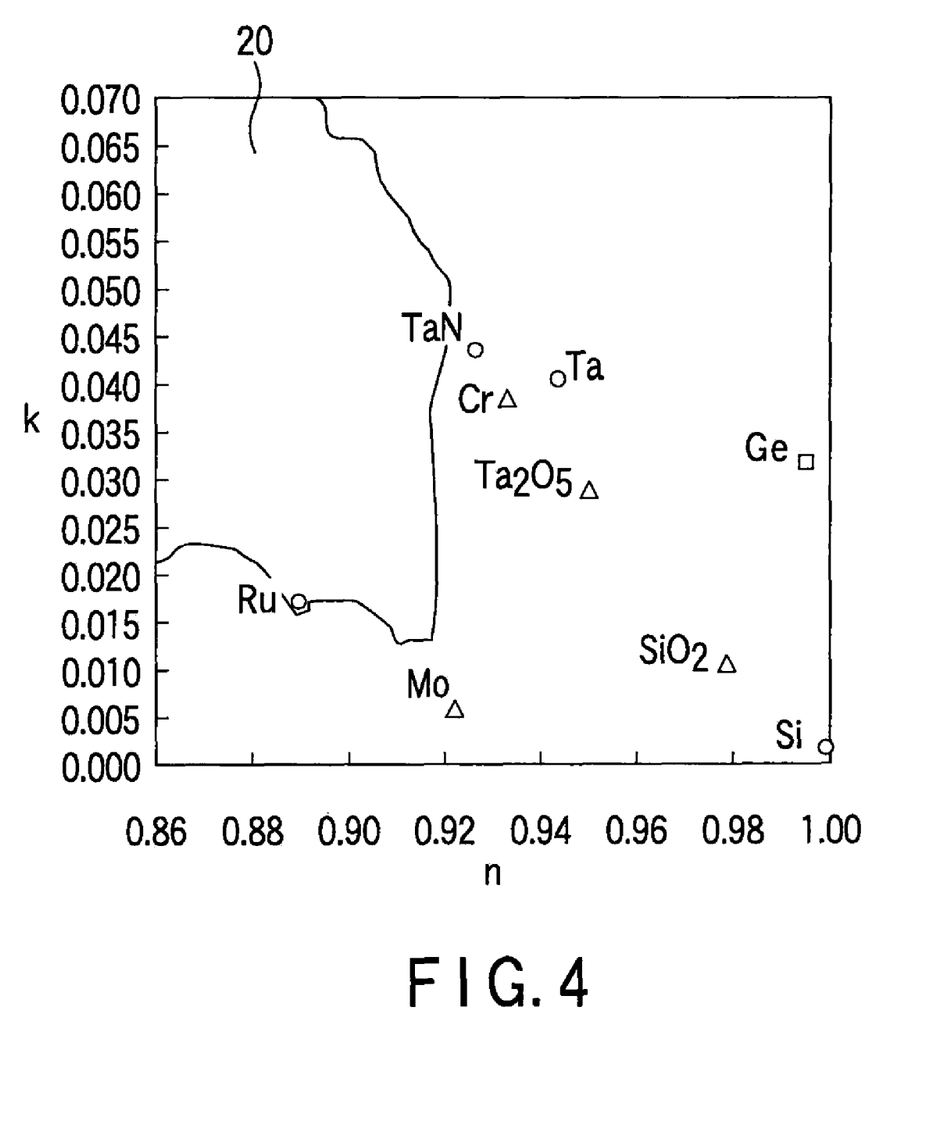
FIG. 4 is a graph showing an overlapping region between a region of optical constants n and k, obtained from FIG. 2, which satisfy the absorber film thickness of 40 nm or less, and a region of optical constants n and k, obtained from FIG. 3, which satisfy the reflectance ratio of 4% to 40%.

As is understood from FIG. 2 and FIG. 3, by using Ru as the absorber material, the thickness of the absorber layer, which satisfies the phase difference of 180°, can be set at 40 nm or less, and the range of the reflectance ratio can be set at 4% to 40%. The lower limit of the thickness of the absorber layer, which satisfies the phase difference of 180°, is estimated at 20 nm, on the basis of FIG. 2 and the range of presently assumed optical constants. FIG. 4 shows an overlapping region 20 between a region of optical constants n and k, obtained from FIG. 2, which satisfy the absorber film thickness of 40 nm or less, and a region of optical constants n and k, obtained from FIG. 3, which satisfy the reflectance ratio of 4% to 40%.

On the other hand, in the case of using the Ta-based material or Cr-based material as the absorber material, as described above, the range of the reflectance ratio, which is usable for the halftone-type phase shift mask, is 1% to 3%.

As has been described above, according to the present embodiment, compared to the conventional technology, the range of the reflectance ratio, which is usable for the halftone-type phase shift mask, becomes wider. Thus, even if the target dimension reaches a finer dimensional region on the order of 20 nm HP or less, the reflection-type exposure mask, which can suppress the shadowing effect by making use of the halftone-type phase shift mask, can easily be realized. If the range of the usable reflectance ratio is 4% to 40%, as described above, the reflection-type exposure mask, which can suppress the shadowing effect by making use of the halftone-type phase shift mask, can easily be realized even if the target dimension reaches a still finer dimensional region on the order of less than 16 nm HP, and even if the target dimension reaches an extremely fine dimensional region on the order of 10 nm HP.

According to the present embodiment, compared to the conventional technology, the range of the reflectance ratio, which is usable for the halftone-type phase shift mask, becomes wider. Thus, even if the target dimension reaches a finer dimensional region than in the present, the reflection-type exposure mask, which can suppress the shadowing effect by making use of the halftone-type phase shift mask, can easily be realized.

As regards the reflection-type exposure mask blanks including the absorber layer having the thickness that satisfies the above-described phase difference) (180°) and reflectance ratio (4% to 40%), the image contrast value of the reflection-type exposure mask having the absorber pattern, which is obtained by processing the absorber layer, was examined.

Figure 5A:
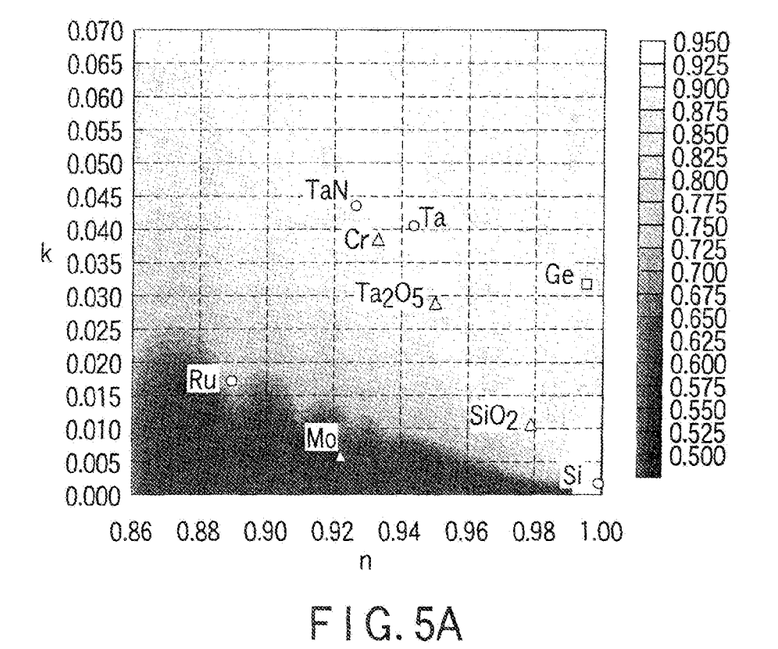
FIG. 5A and FIG. 5B are graphs showing contour lines of image contrast values of a parallel pattern and a perpendicular pattern (target dimension: 32 nm HP) in the case of the phase difference of 180.
Figure 5B:
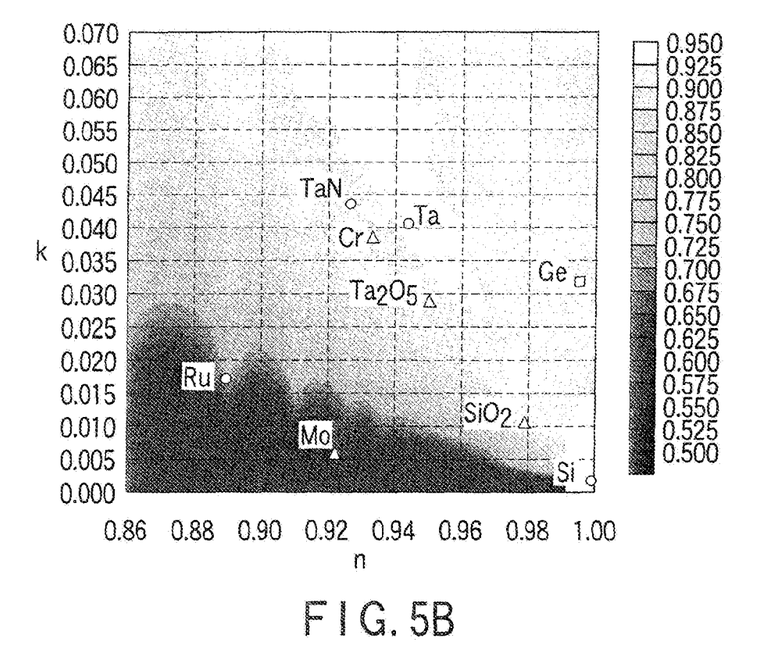
Figure 6A:
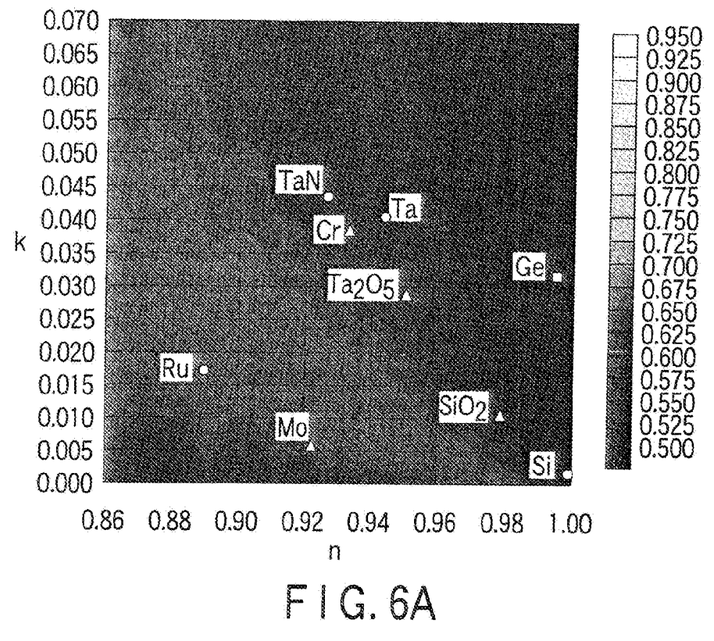
FIG. 6A and FIG. 6B are graphs showing contour lines of image contrast values of a parallel pattern and a perpendicular pattern (target dimension: 16 nm HP) in the case of the phase difference of 180.
Figure 6B:
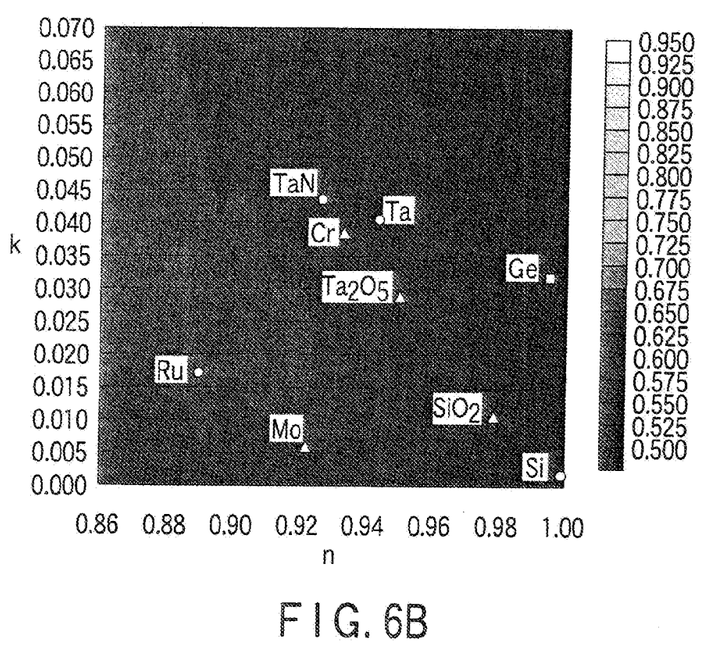

The result of the examination is shown in FIG. 5A and FIG. 5B and in FIG. 6A and FIG. 6B. In these Figures, the image contrast values were obtained by simulations. Besides, the image contrast values are contrast values of an optical image of the absorber pattern which is to be transferred onto the wafer. If the maximum value of the optical image (the maximum value of the light intensity distribution on the wafer) is Imax, and the minimum value of the optical image (the minimum value of the light intensity distribution on the wafer) is Imin, the image contrast value is defined by (Imax−Imin)/(Imax+Imin).

FIG. 5A and FIG. 5B show contour lines of image contrast values on the n-k plane, in the case where the absorber pattern is a line pattern with a target dimension of 32 nm HP. FIG. 5A shows a line pattern (parallel pattern) having a longitudinal direction parallel to the light incidence direction. FIG. 5B shows an example of a line pattern (perpendicular pattern) having a longitudinal direction perpendicular to the light incidence direction. Here, the line pattern is an L&S pattern of 1:1.

The exposure condition is: the numerical aperture NA=0.25, the coherence factor σ=0.8, and the central wavelength λ=13.5 nm (13.45 nm to 13.55 nm).

As is understood from FIG. 5A and FIG. 5B, in the case where the target dimension is 32 nm HP, there is substantially no difference in contour lines of image contrast values between the parallel pattern and the perpendicular pattern, and the degradation of the image contrast value in the perpendicular pattern is sufficiently small.

FIG. 6A and FIG. 6B show contour lines of image contrast values on the n-k plane, in the case where the absorber pattern is a line pattern with a target dimension of 16 nm HP. FIG. 6A shows a line pattern (parallel pattern) having a longitudinal direction parallel to the light incidence direction. FIG. 6B shows an example of a line pattern (perpendicular pattern) having a longitudinal direction perpendicular to the light incidence direction. Here, the line pattern is an L&S pattern of 1:1.

The exposure condition is: the numerical aperture NA=0.3, the coherence factor σin/σout=0.3/0.7, and the central wavelength λ=13.5 nm (13.45 nm to 13.55 nm).

As is understood from FIG. 6A and FIG. 6B, in the case where the target dimension is 16 nm HP, there is a difference in contour lines of image contrast values between the parallel pattern and the perpendicular pattern, and the degradation of the image contrast value in the perpendicular pattern is large.

In addition, in the case of the perpendicular pattern, unless the refractive index (n) is in the range less than about 0.92, the image contrast value does not become 0.6 or more. If this range of the refractive index is applied to FIG. 2, the thickness of the absorber layer (absorber pattern) becomes less than slightly over 40 nm. Thus, in order to suppress the lowering of the image contrast value and to suppress the shadowing effect, the thickness of the absorber layer (absorber pattern) is set at 40 nm or less.

Furthermore, in the case of adopting the Ta-based material or Cr-based material as the absorber material, it is understood that the image contrast value of 0.6 or more cannot be satisfied.

However, in the case where the absorber layer 4, which includes Ru as a main component and has a thickness of 29 nm, is used as the absorber material of the reflection-type exposure mask for the target dimension of 16 nm HP, the image contrast value of 0.6 or more can be satisfied with respect to both of the parallel pattern and perpendicular pattern.

The reason why the image contrast value is set at 0.6 or more is that if the image contrast value is less than 0.6, the contrast of the transfer image on the wafer lowers and a good resist image on the wafer cannot be obtained. In the meantime, although the lower limit value of the image contrast value varies in accordance with the size of the absorber pattern, it is hardly thinkable that the image contrast value, which is required at the present, becomes lower in the future. Thus, on the basis of the present trend of photomasks, the lower limit of the image contrast value is set at 0.6. By determining the lower limit of the image contrast value as in the present embodiment, when a resist on the wafer, onto which an optical image corresponding to an absorber pattern of the reflection-type exposure mask has been transferred, is developed, the resist pattern having the pattern corresponding to the absorber pattern can be formed.

A method of manufacturing a semiconductor device using the reflection-type exposure mask of the present embodiment is as follows.

To start with, a resist is applied on a substrate including a semiconductor substrate. The semiconductor substrate is, for instance, a silicon substrate or an SOI substrate.

Subsequently, a reflection-type exposure mask of the present embodiment is disposed above the substrate, and light or a charged particle beam enters onto the resist through the reflection-type exposure mask. Then, the resist is developed and a resist pattern is formed.

Next, by using the resist pattern as a mask, the substrate is etched, and a fine pattern is formed.

Here, in the case where an underlying layer (the uppermost layer of the substrate) of the resist is a polysilicon film or a metal film, a fine electrode pattern or wiring pattern is formed. In the case where the underlying layer (the uppermost layer of the substrate) of the resist is an insulation film, a fine contact hole pattern or gate insulation pattern is formed. In the case where the underlayer of the resist is the above-described semiconductor substrate, a fine shallow trench isolation (STI) is formed.

The above-described the application of resist, the forming of resist pattern and etching of substrate are repeated to form a necessary fine pattern, and thus a semiconductor device is manufactured. The method of manufacturing the semiconductor device using the reflection-type exposure mask of the present embodiment is suitably applicable, for example, to the manufacture of a fine flash memory.

Figure 9:
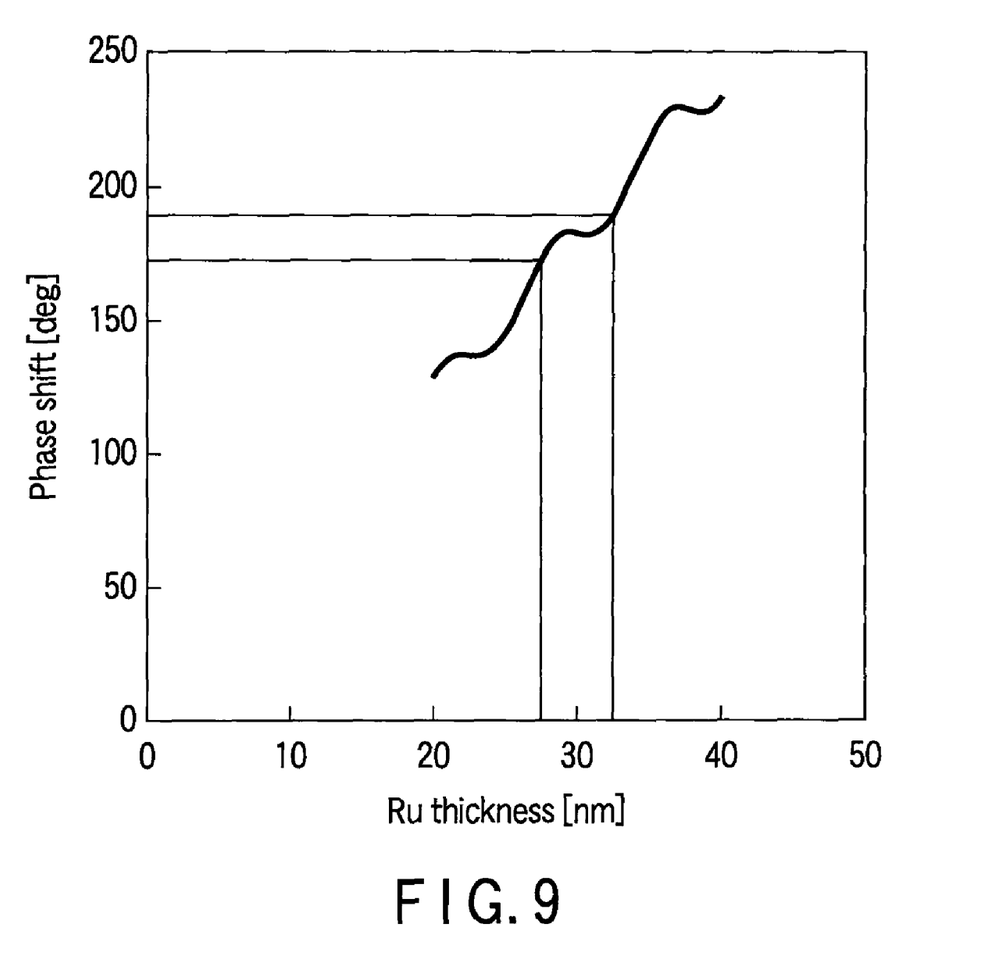
FIG. 9 is a graph showing the relationship between the thickness of a Ru film and a phase difference.

The above-described embodiment is directed to the case (best mode) of the absorber pattern (absorber layer) having the thickness which satisfies the phase difference of 180°. However, the phase difference may be in the range of 180°±10°. The reason for this is that if the phase difference is in the range of 180°±10°, the halftone mask effect can be obtained. In the case where the main component of the absorber material is Ru, as shown in FIG. 9, the thickness (Ru thickness) of the Ru absorber pattern (Ru absorber layer) is set in the range of 30 nm±3 nm. Thereby, the phase difference (Phase shift) can be set in the range of 180°±10°.

In addition, in the above-described embodiment, the image contrast values are obtained by simulations. Alternatively, the image contrast values may be obtained by actual measurement using an optical image acquisition apparatus with exposure wavelengths, which is called "Aerial Image Measurement System".

Furthermore, in the above-described embodiment, the absorber pattern 4P having the single-layer structure constituted by the Ru film of Ru as a main component is used, but a absorber pattern having a multilayer structure may be used in order to adjust the value of the reflectance ratio. The above multilayer structure is a multilayer film comprising a Ru film and a Cr film which is thinner than the Ru film and formed of Cr as a main component, or a multilayer film comprising a Ru film and a Ta film which is thinner than the Ru film and formed of Ta as a main component For example, a Ru/TaN absorber pattern of a multilayer structure maybe used, in which the multilayer structure comprises an absorber pattern including Ru as a main component, and an absorber pattern which is thinner than above absorber pattern and is formed of TaN-based material (material including Ta as a main component). In this case of the Ru/TaN absorber pattern, the reflectance ratio of 20% is realized at 180° phase difference by setting the thickness of Ru absorber pattern on 21 nm and the thickness of TaN absorber pattern on 19 nm.

The material includes Ru as a main component means that the material may be a single-element metal of Ru, or a Ru alloy (an alloy including Ru as a main component). CrRu alloy, or CrRuN alloy is given as the example of Ru alloy.

At the time of a foreign matter defect inspection which is conducted in the mask defect inspection process, in order to secure a necessary contrast, an antireflection film for preventing reflection of light that is used in the inspection may be formed on the surface of the absorber pattern 4P. In the step of FIG. 1A, the antireflection film is formed on the absorber layer 4.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A reflection-type exposure mask comprising:
a main surface to be irradiated with exposure light;
a multilayer reflective film provided in the main surface and serving as a high reflective region to the exposure light such; and
an absorber pattern provided on the multilayer reflective film and configured to absorb the exposure light while serving as a low reflective region to the exposure light;
wherein a phase difference between a reflection light of the exposure light from the multilayer reflective film and a reflection light of the exposure light from the absorber pattern is in a range of 180°±10°, and
the absorber pattern comprises a first linear pattern, and a second linear pattern having a longitudinal direction perpendicular to that of the first linear pattern, the first and second patterns are configured such that contrast values of optical images of the first and second linear patterns on a wafer are to be 0.6 or more in a case where one of the longitudinal directions of the first and second patterns agree with an incident direction of the exposure light to the main surface viewed from above the main surface.

2. The mask according to claim 1, wherein a reflectance ratio of the reflection light of the exposure light from the absorber pattern to the reflection light of the exposure light from the multilayer reflective film is in a range of 4% to 40%, and thickness of the absorber pattern is not less than 20 nm and not higher than 40 nm.

3. The mask according to claim 1, wherein main component of the absorber pattern is Ru, and the thickness of the absorber pattern is in a range of 30 nm±3 nm.

4. The mask according to claim 1, wherein the absorber pattern corresponds to a pattern having target dimension not higher than 20 nm HP.

5. The mask according to claim 1, wherein the exposure light is EUV light.

6. The mask according to claim 1, wherein the multilayer reflective film is a plurality of pairs of a Mo film and a Si film which are stacked.

7. The mask according to claim 1, wherein the multilayer reflective film is provided on a glass substrate.

8. The mask according to claim 1, further comprising a protective film provided on the multilayer reflective film.

9. The mask according to claim 8, wherein the protective film includes a Si film.

10. The mask according to claim 1, wherein the absorber pattern comprises a single-layer structure.

11. The mask according to claim 10, wherein main component of the single-layer structure includes Ru.

12. The mask according to claim 1, wherein the absorber pattern comprises a multi-layer structure.

13. The mask according to claim 12, wherein main component of the multi-layer structure includes a film whose main component is Ru, and a film whose main component is Cr.

14. The mask according to claim 12, wherein main component of the multi-layer structure includes a film whose main component is Ru, and a film whose main component is Ta.

15. The mask according to claim 1, wherein the first and second linear patterns are line-and-space patterns respectively.

16. The mask according to claim 1, wherein the first and second linear patterns are line patterns with rectangular end portions respectively.

17. A method of manufacturing a semiconductor device comprising:

exposing a resist formed on a substrate including a semiconductor substrate by using a reflection-type exposure mask of any one of the preceding claims;

forming a resist pattern by developing the exposed resist; and etching the substrate by using the resist pattern as a mask.

18. The method according to claim 17, wherein a reflectance ratio of the reflection light of the exposure light from the absorber pattern to the reflection light of the exposure light from the multilayer reflective film is in a range of 4% to 40%, and thickness of the absorber pattern is not less than 20 nm and not higher than 40 nm.

19. The method according to claim 17, wherein an underlying layer of the resist includes a semiconductor film, a metal film, an insulating film, or the semiconductor substrate.

20. The method according to claim 17, wherein the resist pattern includes a pattern corresponding to an electrode, a wiring, a contact hole, or an isolation trench.

* * * * *